United States Patent [19]

Prada

[11] 4,241,337
[45] Dec. 23, 1980

[54] APPLIANCE DOOR POSITION SENSOR ARRANGEMENT

[75] Inventor: Luis E. Prada, Louisville, Ky.

[73] Assignee: General Electric Company, Louisville, Ky.

[21] Appl. No.: 25,214

[22] Filed: Mar. 29, 1979

[51] Int. Cl.³ ............................................. G08B 13/08
[52] U.S. Cl. ...................... 340/547; 62/131; 200/61.19; 335/206
[58] Field of Search ............................... 340/547, 686; 200/61.69, 61.62; 335/206, 205, 207; 62/131; 49/13

[56] References Cited

U.S. PATENT DOCUMENTS

| | | | |
|---|---|---|---|
| 2,877,361 | 3/1959 | Chase | 340/547 |
| 2,957,320 | 10/1960 | Armentrout | 200/61.62 |
| 3,199,630 | 8/1965 | Engel et al. | 187/29 |
| 3,426,166 | 2/1969 | Canceill | 340/547 |
| 3,539,741 | 11/1970 | Voland | 200/61.62 |
| 3,627,959 | 12/1971 | Chapell | 200/61.62 |

*Primary Examiner*—Glen R. Swann, III
*Attorney, Agent, or Firm*—Frederick P. Weidner; Radford M. Reams

[57] ABSTRACT

A magnet and one or more magnetic field responsive switches, preferably Hall effect sensors, are respectively mounted in alignment on opposing edges of a two door refrigerator in one preferred embodiment. Movement out of alignment of either the magnet or switch generates a door ajar signal to activate visual and/or audio alarms. Embodiments employing mono-polar and bipolar Hall effect sensors are shown. A single door embodiment is shown with the magnet held in a fixed position opposite the sensor mounted on the door edge.

7 Claims, 8 Drawing Figures

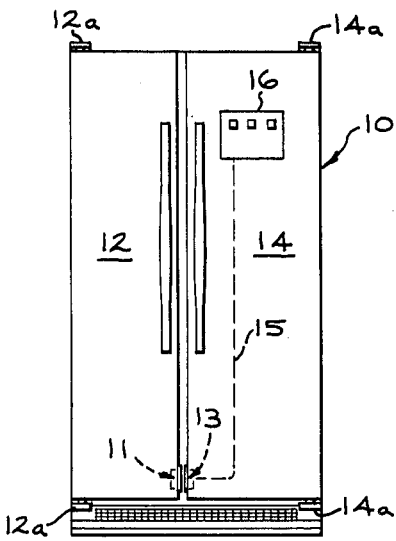
FIG. 1
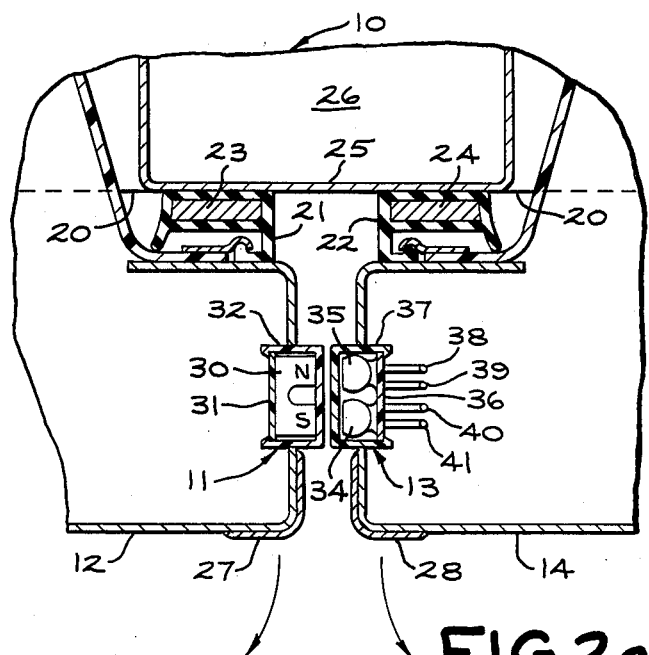
FIG. 2a
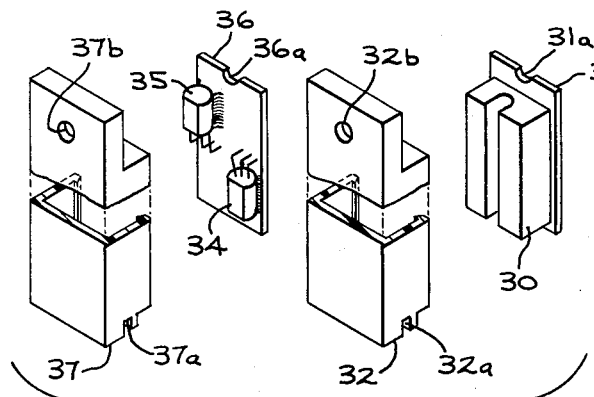
FIG. 2b
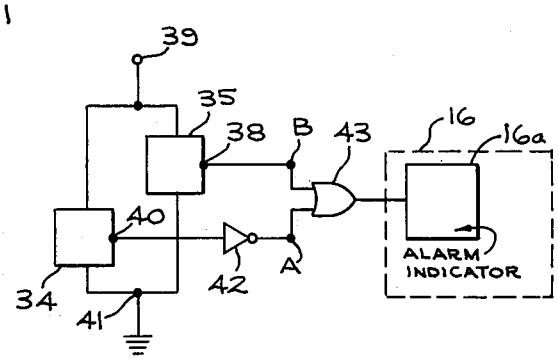
FIG. 3
| STATE | EQUN CKT | POTENTIAL AT OUTPUT OF SWITCH | LOGIC STATE | DOOR STATUS | TRUTH TABLE OUTPUT | |
|---|---|---|---|---|---|---|
| | | | | | A | B |
| ON | —o/ o— [S] | GND | 1 | 1. BOTH CLOSED | 0 | 0 |
| | | | | 2. FZR. OPEN | 1 | 0 |
| OFF | —o/ o— [N] | POS | 0 | 3. F.F. OPEN | 0 | 1 |
| | | | | 4. BOTH OPEN | 1 / 0 | 0 / 1 |
FIG. 4

APPLIANCE DOOR POSITION SENSOR ARRANGEMENT

BACKGROUND OF INVENTION

The present invention relates to a novel sensor arrangement useful in sensing the position of appliance doors and particularly in sensing when refrigerator/freezer doors are open or slightly ajar.

In the case of refrigerators and freezers, it is desired to provide a warning indication to the owner when a door is open or slightly ajar so that the door can be closed and thus eliminate excessive energy usage and protect the stored food from spoiling. Sensors for this purpose have been used in the past. Typically, a well known sensor arrangement involves the use of a plunger protruding from the front frame of the refrigerator cabinet such that when the door is properly closed, it pushes back to open the contacts of a microswitch. When the door is open, the plunger moves forward until the microswitch contacts close causing a "door open" alarm to sound. Similar arrangements are used to activate interior lights.

While useful as door alarms, these arrangements have certain disadvantages. If operated at low voltages and low currents, the design of the microswitch contacts, usually gold plated, makes them expensive for appliance use. Also, it is required to provide proper plunger and housing design so as to enable them to pass wash tests and remain free from contaminants.

Magnetic devices have also been used in which either a magnet (or magnetic field sensor) has been mounted in the face frame of the refrigerator and the magnetic field sensor (or magnet) is mounted on the interior face of the door. These are less sensitive to dirt problems but are not readily adapted to slight door-ajar movements or positioning of the door.

Additionally, the use of frame mounted devices require that, for a two door appliance, the sensor arrangement be duplicated, one for each door.

OBJECTS AND SUMMARY OF INVENTION

It is, therefore, an object of the present invention to provide a door position sensor that obviates the above disadvantages.

It is also an object of the present invention to provide a door position sensor that is sensitive to small movement of the door.

It is further an object of the present invention that is particularly well adapted to double door appliances while being less expensive than prior arrangements requiring duplication thereof for each door.

Therefore, in accordance with an aspect of the present invention, there is provided a door position sensor arrangement for an appliance having at least one access opening defined by a frame and having a door therefor which is hinged at one side thereof. The door sensor arrangement comprises means for producing a magnetic field and switch means operatively responsive to said magnetic field. A first one of these means is mounted on the edge of the door. The other of said devices is mounted at a position spaced forward of the frame and directly opposite the first means such that the switch means is influenced by the magnetic field to be in a first switch condition when the door is properly closed and in a second switch condition when the door is spaced away from said properly closed position by at least a predetermined amount. The arrangement further comprises means responsive to the second switch condition of the switch means to provide an indication that the door is not properly closed.

BRIEF DESCRIPTION OF THE DRAWINGS

FIG. 1 is a front view of a two door side-by-side refrigerator/freezer showing the location of a door sensor arrangement mounted thereon in accordance with a feature of the present invention.

FIG. 2a is a top partial sectional view of a side-by-side refrigerator/freezer illustrating structural mounting details of one embodiment of the present invention.

FIG. 2b shows details of the components used in the embodiment of FIG. 2a.

FIG. 3 shows a schematic circuit for the FIG. 2a embodiment.

FIG. 4 is a chart useful in explaining the operation of the FIG. 2a embodiment.

DETAILED DESCRIPTION OF THE PREFERRED EMBODIMENT

Figure 5:
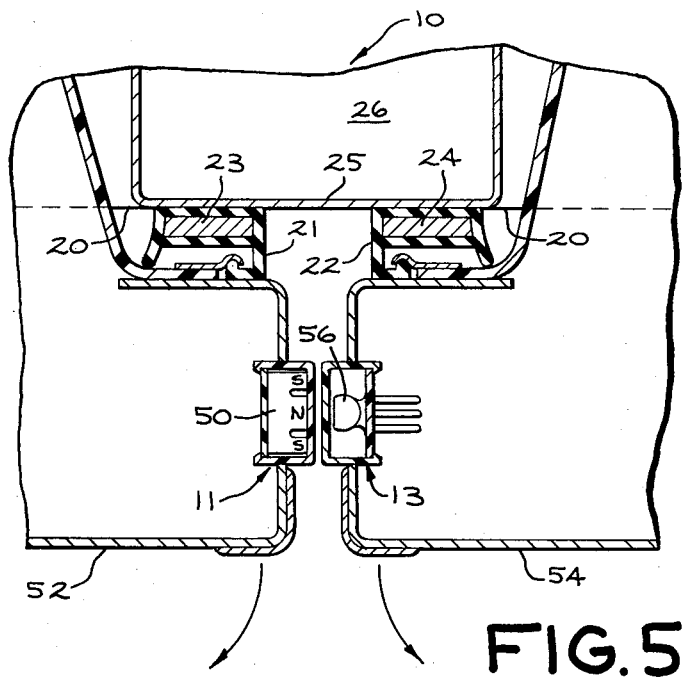
FIG. 5 illustrates an alternative embodiment of the present invention as mounted on a side-by-side refrigerator/freezer.

Referring now to FIG. 1 there is shown a side-by-side refrigerator/freezer 10 with a door sensor arrangement mounted thereon comprising means 11 for producing a magnetic field being mounted on the peripheral edge of one of the doors, for example the freezer door 12. Switch means 13 operatively responsive to the magnetic field from means 11 is then mounted on the peripheral edge of the fresh food door 14 preferably directly opposite magnet means 11. Freezer door 12 is conventionally hinged on the left side by hinges 12a and the fresh food door 14 is hinged at the right side by hinges 14a such that the free swinging vertical edges of the doors 12, 14 are in common alignment facing each other when the doors are in a properly closed position. Switch means 13 responds to the field emanating from magnet means 11 to generate a voltage level signal which is representative of the position (closed or open/ajar) of either or both of doors 12, 14, which signal is conveyed by a wire 15 to an alarm indicator device, such as a light or an audible alarm, on an indicator panel 16 positioned on the front of door 14. An important feature of the present invention is that positioning the magnet and sensor switch on the door edges enables a "door ajar" condition of either door to be sensed by a single sensor. Also, when using any of the embodiments described subsequently, very slight door ajar conditions can be sensed, on the order $\frac{1}{8}"$ to $\frac{1}{4}"$. Additionally, locating the switch means 13 within the door panel enables the signal wire to be run directly to the alarm device on the door without passing through a door hinge. It will be appreciated that the arrangement may be reversed with sensor switch 13 and indicator panel 16 mounted on the freezer door and the magnet 11 mounted on fresh food door 14.

Referring now to FIGS. 2a and 2b, there is shown a portion of the refrigerator/freezer 10 including the front face of cabinet frame 20 which surrounds the refrigerator and freezer compartments. Door gaskets 21, 22 with internal magnets 23, 24 provide an air sealed closure to the breaker frame 25 of the refrigerator/freezer cabinet 26. Breaker frame 25 comprises the vertical component of the cabinet frame 20. Gasket 21 is mounted on freezer door 12 and gasket 22 is mounted on fresh food door 14 in conventional manner. The material of doors 12, 14 may typically be steel. There may also be secured to the front corners of each door an appearance strip 27, 28 which may be of aluminum or other suitable material.

In accordance with the invention, magnetic field means 11 includes a magnet 30 secured to board 31 and encased within a housing 32. Magnet 30 is preferably elongated in the vertical direction and includes a pair of opposite polarity pole faces lying in vertical plane extending perpendicularly outward from frame 20. The assembly is mounted on the edge of, in this case, freezer door 12. A magnetic field responsive switch device 13 comprises a pair of Hall effect sensor switches 34, 35 mounted on a printed circuit board 36 and encased within switch housing 37. Electrical connectors 38, 39, 40, 41 extend out the rear of board 36 for connection thereto of operating voltage, ground, and two signal output lines via cable 15 (not shown) from panel 16.

As shown in FIG. 2b, sensor switches 34, 35 may be mounted one above the other, slightly offset in the horizontal direction so that, as mounted on the edge of fresh food door 14 with both doors 12, 14 in a properly closed position, sensor switch 34 is directly opposite the south pole and sensor switch 35 is directly opposite the north pole, respectively, of magnet 30. With this vertical offset arrangement of the sensor switches 34, 35, very precise alignment of the switches and magnet pole faces is achieved. It is possible with this arrangement to sense misalignments on the order of $\frac{1}{8}''$.

Preferably, the structure of magnet means 11 and switch means 13 is such that, when assembled on the doors, the switches and magnet poles are assured to be in the correct orientation. Thus, for example, boards 31 and 36 may include notches 31a and 36a at the top to mate with ridges inside the housings 32 and 37 thus assuring that the magnet and switches cannot be assembled upside down. Similarly, the housings 32, 37 each include a slot 32a, 37a at the bottom which slip over the bottom edge of an aperture in the door edge, the top of each housing being held, respectively, by a single screw through holes 32b and 37b. In this way, correct vertical orientation is assured when housings 32, 37 are assembled to the doors.

Hall effect sensors, in accordance with known principles, are responsive to magnetic fields to develop a voltage output that depends on the polarity of the magnetic field to which the sensor is exposed. A positive magnetic field may be defined as that field direction which is emitted from the south pole of a permanent magnet. In the FIG. 2a switch arrangement, bipolar Hall effect devices are used in which the voltage output of the device is brought to a first level, such as ground potential (arbitrarily referred to herein as the ON state), when a magnet's south pole field of appropriate strength is brought to the proximity of the Hall effect sensor. The sensor then remains latched in the ON state until a north pole field of appropriate strength is brought to the proximity of the sensor. When this happens, the sensor voltage output changes to a different level, such as a positive potential corresponding to an OFF condition, where it remains latched until a south pole is again brought to the proximity of the sensor.

Considering now FIG. 2a in conjunction with FIGS. 3 and 4, it will be seen that when the doors are in the properly closed position, magnet 30 is arranged to provide north and south field polarities between the edges of the closed doors, the two polarities being spaced laterally in a direction orthogonal to the breaker frame 25. Thus with the doors properly closed, as shown, the Hall effect sensor of switch 35 is directly opposite the north pole of magnet 30 while the horizontally offset Hall effect sensor of switch 34 is directly opposite the south pole of magnet 30. With this alignment, switch 35 is the equivalent of an open switch corresponding to a "0" logic state while switch 34 is the equivalent of a closed switch corresponding to a "1" logic state (FIG. 4). The output of switch 34 is then passed through an inverter 42, which may be located within the circuitry associated with panel 16, so that outputs A and B may then correspond to that shown in the truth table of FIG. 4. Thus the two "0" outputs may then be passed through a logic OR circuit 43 to provide a "0" at the output thereof to serve as a control signal which suppresses the activation of alarm indicator 16a. Alarm indicator 16a is adapted to be activated whenever a logic "1" appears at the output of the OR circuit 43. If freezer door 12 is opened, the north pole of magnet 30 will cause the output of switch 34 to change so that, after inversion in inverter 42, a logic "1" appears at output A. Output B remains a logic "0" since the south pole has not passed in front of switch 35. The "1"-"0" inputs to OR circuit 43 change its output to a "1" thus permitting the alarm indicator 16a to be activated. In practice, a delayed sound alarm and an immediate visual indicator may be employed to allow for normal use of the refrigerator.

Similarly, it will be seen that opening of the fresh food door 14 will change outputs A, B to that shown on line 3 of the truth table which causes a "1" to appear at the output of OR circuit 43 thus activating the alarm indicator 16a in the same manner.

It will be appreciated from the foregoing that, if either door is held slightly ajar by an amount sufficient to align the magnet north pole with switch 34 or the magnet south pole with switch 35, such misalignment will produce the same logic states as opening of either door, thereby providing the desired activation of the alarm indicator 16a. Also opening both doors normally will activate the alarm indicator as shown by line 4 of the truth table. Theoretically, one might carefully open both doors simultaneously without disturbing the relative alignment of the magnet poles and switch sensors thereby not activating the alarm indicator. In practice, however, the precision alignment of the devices makes it highly unlikely this would ever happen under normal conditions.

With the arrangement of FIG. 2a, it is possible, as an alternative arrangement, to combine the outputs of A and B in suitable discrete logic circuits located within panel 16 to provide selective activation of separate alarm indicators, one for the freezer door 12 and one for the refrigerator door 14. The manner in which this can be done will be readily apparent to those skilled in logic circuit design. In a further alternative arrangement, outputs A and B may be applied to a suitably programmed microprocessor in panel 16 also to provide selective activation of separate alarm indicators.

Considering now FIG. 5, an alternative embodiment of the sensor arrangement is shown which is useful when it is not necessary to provide selective activation of separate alarms to identify the door that is ajar. Thus a single bipolar Hall effect switch 56 is mounted on the edge of refrigerator fresh food door 14. A three pole magnet 50 is mounted on freezer door 12 opposite switch 56 so that, when both doors are in the properly closed position, the central north pole of magnet 50 is directly opposite and aligned with the Hall effect sensor of switch 56. As assembled on the door 52 north pole of magnet 50 is flanked by two south poles along a line orthogonal to the face plane of breaker frame 25. Thus, with the arrangement as described, when the doors are properly closed a "0" logic state is produced at the output of switch 56 to suppress the alarm indicator. When either door is opened or held slightly ajar, switch 56 passes into or through a south pole field changing the output logic state to a "1" which activates the alarm indicator.

An even simpler version of the sensor arrangement of FIG. 5 may be constructed by substituting a monopolar Hall Effect sensor for the bipolar sensor of switch 56. A monopolar sensor is one in which a first switch state, e.g. corresponding to the ON logic state, is achieved only when the monopolar Hall effect sensor is in the presence of a south magnetic field, and reverts to the OFF state whenever the south field is removed. With this type of sensor, a simple disc magnet may be substituted for the three pole magnet 50 of FIG. 5 with the south pole of the disc magnet facing the sensor switch.

Figure 6:
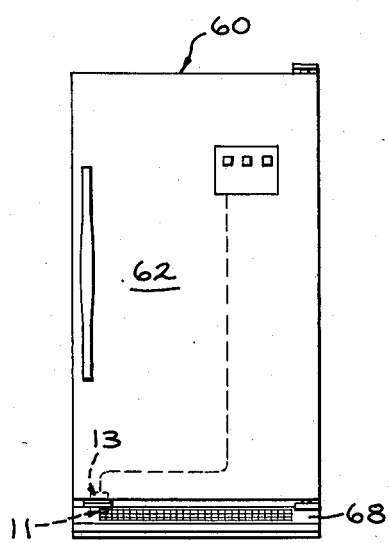
FIGS. 6 and 7 shows a front and partial side view, respectively, of a single door refrigerator illustrating the mounting thereon of a door sensor arrangement in accordance with another aspect of the present invention.
Figure 7:
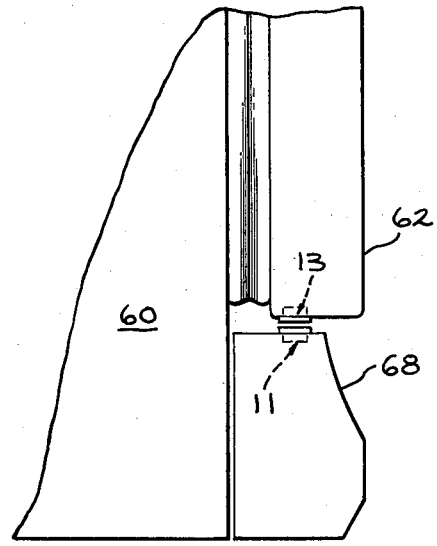

In FIGS. 6 and 7, there is shown the manner in which the door sensor arrangement may be mounted on a single door refrigerator 60 (or similar appliance). In this arrangement, sensor switch means 13 is preferably mounted on the bottom edge of door 62 and the appropriate magnet means 11 may be mounted on the upper horizontal surface of a grill/kick panel 68 customarily provided at the bottom of the refrigerator. While any of the specific sensor arrangements heretofore described may be employed in the single door arrangement, the nonselective door indicator arrangements may be preferred since only a single door is involved.

While, in accordance with the patent statutes, there have been described what at present are considered to be preferred embodiments of the invention, it will be obvious to those skilled in the art that various changes and modifications may be made therein without departing from the invention. It is, therefore, intended by the appended claims to cover all such changes and modifications as fall within the true spirit and scope of the invention.

What is claimed:

1. A door position sensor arrangement for an appliance having at least one access opening defined by a frame and a door therefor which is hinged at one side thereof, the arrangement comprising:
   means for producing a magnetic field;
   switch means operatively responsive to said magnetic field;
   a first one of said means being mounted on the edge of said door, the second of said means being mounted at a position spaced forward of said frame and directly opposite said first means, said first and second means being aligned generally in a plane that passes through the door edge and is parallel to the plane of said access opening, such that said switch means is influenced by said magnetic field to be in a first switch condition when the door is properly closed and in a second switch condition when the door is spaced away from said properly closed position by at least a predetermined amount;
   and means responsive to said second condition of the switch means for providing an indication that the door is not properly closed.

2. The door sensor arrangement of claim 1 in which the switch means is mounted on said door edge.

3. The door sensor arrangement of claim 2 in which said switch means and magnetic field producing means are mounted so as be on opposite sides of a vertical plane that is also perpendicular to the access opening.

4. The door sensor arrangement of claim 1 in which the switch means includes at least one Hall effect sensor responsive to a predetermined polarity of the magnetic field so as to be set in said first condition representative of proper closure of the door.

5. A door position sensor arrangement for a two-door appliance having adjoining compartments with access openings defined by a figure-eight shaped frame and in which the doors are pivotally hinged, the free swinging edges of which are in common alignment facing each other when the doors are in a properly closed position, said arrangement comprising:
   means mounted on one of said free swinging door edges for producing a predetermined magnetic field emanating from said door edge;
   switch means mounted on the other of said free swinging door edges and being operatively responsive to said magnetic field to be in a first switch condition when said doors are properly closed and in a second switch condition when either of said doors is spaced away from said properly closed position by at least a predetermined amount;
   and means responsive to said second condition of the switch means for providing an indication that either of said doors is not properly closed.

6. The door sensor arrangement of claim 5 in which the magnetic field includes two polarity components in the space between the closed door edges which are spaced laterally in a direction orthogonal to said opening frame and in which said switch means includes a pair of bipolar Hall effect sensors individually responsive to one of said field polarities whereby movement of either door by said predetermined amount causes at least one of said Hall effect sensors to change state thereby placing said switch means in said second condition.

7. The door sensor arrangement of claim 5 in which said magnetic field producing means comprises a three pole magnet having a central pole of one polarity laterally flanked along a line orthogonal to said frame by two poles of a second polarity; and in which said switch means includes a single bipolar Hall effect sensor mounted to be responsive to said central pole magnetic field when the doors are in a properly closed position, whereby movement of either door by said predetermined amount relative to the other door causes said Hall effect sensor to change state in response to said second magnetic field polarity so as to place said switch means in said second condition.

* * * * *